United States Patent [19]
Rensink et al.

[11] Patent Number: 5,638,069
[45] Date of Patent: Jun. 10, 1997

[54] HIGH THROUGHPUT VARIABLE LENGTH DECODER AND APPARATUS COMPRISING SUCH DECODER

[75] Inventors: Alexander M. Rensink; Albert Van Der Werf; Robert A. Brondijk; Wilhelmus H. A. Bruls, all of Eindhoven, Netherlands

[73] Assignee: U.S. Philips Corporation, New York, N.Y.

[21] Appl. No.: 697,118

[22] Filed: Aug. 20, 1996

Related U.S. Application Data

[63] Continuation of Ser. No. 255,508, Jun. 8, 1924, abandoned.

[30] Foreign Application Priority Data

Jun. 10, 1993 [EP] European Pat. Off. .............. 93201653

[51] Int. Cl.$^6$ ............................................. H03M 7/40
[52] U.S. Cl. ................................. 341/67; 341/50
[58] Field of Search ............................. 341/50, 59, 65, 341/67; 358/261.1–261.3

[56] References Cited

U.S. PATENT DOCUMENTS 5,097,261  3/1992  Langdon, Jr. et al. .................. 341/51
5,394,144  2/1995  Kim ........................................... 341/67
5,424,733  6/1995  Fimoff et al. ............................. 341/67

OTHER PUBLICATIONS

"Designing High–Throughput VLC Decoder Part I–Concurrent VLSI Architectures", by S.F. Chang et al, IEEE Trans. on Circuits and Sys. for Video Tech., vol. 2, No. 2, Jun. 1992.

M.T. Sun, "VLSI Architecture and Implementation of a High–Speed Entropy Decoder", IEEE 24th Int. Symp. on Circuits and Systems, vol. I, 1991, pp. 200–203.

Primary Examiner—Jeffrey A. Gaffin
Assistant Examiner—Jason L. W. Kost

[57] ABSTRACT

A variable length decoder device receives a stream of variable-length encoded data segments for successive transient storage. The storage is recurrently accessed under control of successive pointers. A decoder is fed by the storage and decodes a stream of data segments each from a respective encoded data segment. Furthermore, in step with the decoding a next pointer is produced as being directly derived from the accessing through reading of a localizer information. The latter again is produced in a preprocessor that sits before the storage, through localizing the data segments and indicating each segment by an associated localizer.

20 Claims, 2 Drawing Sheets

HIGH THROUGHPUT VARIABLE LENGTH DECODER AND APPARATUS COMPRISING SUCH DECODER

This is a continuation division of application Ser. No. 08/255,508, filed Jun. 8, 1994 now abandoned.

FIELD OF THE INVENTION

The invention relates to a variable length decoder device comprising input means for receiving an input stream of variable-length encoded data segments sequential storage means fed by said input means for transient storing of said data segments accessor means for repeatedly and selectively accessing said storage means under control of successive pointer informations and decoder means fed by said accessor means for reproducing an output stream of decoded data segments each derived from a respective encoded data segment, said device having pointer generation means for generating a next said pointer information.

Variable length coding has found applications in various technical fields such as facsimile transmission, digital television transmission, and other technologies where mathematical considerations allow for mapping each actual unencoded segment in such a way on an encoded segment that the overall code length is diminished. In facsimile, for example, successive transitions between black and whim pixels are separated by strings of uniformly valued pixels. By means of encoding these runlengths, substantial data reduction is possible. In digital television, through statistical considerations on occurrence frequencies of particular code configurations, the more probable ones are mapped on relatively short code words, for so attaining an overall data reduction. Similar advantages can be attained in an audio representation, such as used in the Digital Compact Cassette (DCC) system. The term segment can relate to a word, or to longer blocks, according to usage and feasibility. Earlier art on variable length decoders has been published by S. Chang and D. G. Messerschmitt, "Designing High-throughput VLC Decoder, Part I-Concurrent Video Architectures" in IEEE Transactions on Circuits and Systems for Video technology, Vol. 2, No. 2, June 1992, pp. 187–196. The decoder according to the citation will be discussed hereinafter more in detail with reference to FIG. 1. The known solution has an input FIFO and an output decoder. Since the FIFO buffer will contain compressed data, its size may remain relatively small. It accepts data at the substantially constant rate of the channel but the Variable Length Decoder itself requests data at a variable rate. This is caused by the constant output rate of the apparatus in combination with the variable length of the encoded input segments. In consequence, whereas the overall decoder device has both fixed rate input and fixed rate output, the kernel decoder means has a variable rate input. Within for example video applications the output rate will be quite high and it may be difficult to attain the necessary processing rate of the Variable Length Decoder proper.

Now, the processing rate of the pre-buffering architecture according to the reference is limited because of a feedback loop that consists of three major delays:

first, a number of N bits must be selected out of a register that contains at least 2N bits by means of a pointer. Here, N is the number of bits (length) of the largest code word;

second, the length of the current selected code word must be calculated;

third, executing the accumulation of the length with the current pointer value. The result will represent the new value of the pointer.

These three delays mainly determine the length of the critical path. It is very difficult and costly to drastically reduce this length by means of a combinatorial logic speedup. Moreover, retiming is ineffective in case of a feedback loop that contains only a single register element (usually the accumulator). By itself, it has been proposed to increase the number of registers in the feed-back loop in combination with additional logic, cf. Ming-Tin Sun, "VLSI Architecture and Implementation of a High-Speed Entropy Decoder, IEEE 24th Int. Symp. on Circuits and Systems, Vol. I, 1991, because the delay can now be distributed over the intervals between the registers. However, this strategy has only rather restricted applicability.

SUMMARY OF THE INVENTION

Accordingly, amongst other things, it is an object of the present invention to provide a decoder of the kind described in the preamble, that needs a relatively small input buffer only, and through organizational simplicity of the various feedback loop elements allows to realize an operational speed that accommodates to the output channel data rate while only necessitating a simple architecture. Now, according to one of its aspects, the object is realized in that the invention is characterized in that said input means comprising preprocessor means for in said input stream localizing said data segments and indicating each segment by an associated localizer information, and in that said pointer generation means directly derive from said accessor means through reading of said localizer information. Through the introduction of the preprocessor, now also the sequential storage has a variable input rate.

Alternatively, said input means comprising preprocessor means for in said input stream localizing said input data segments and indicating each segment by an associated localizer information, and in that for a multiplicity of interleaved sub-streams of said input stream each such sub-stream has said accessor means, said decoder means, and said pointer generator means time- and/or space-multiplexed for in each thereof producing a decoded sub-stream, the set of decoded substreams collectively constituting said output stream of decoded data segments. Through a slightly different application of the preprocessor, generally the same advantages are reachable.

The invention also relates to an apparatus comprising a decoder according to the invention. Such an apparatus may, for example, be a television receiver apparatus or a facsimile printer. Various further advantageous aspects are recited in dependent Claims.

BRIEF DESCRIPTION OF THE FIGURES

These and other aspects of the invention will be discussed in detail with reference to the preferred embodiments that are disclosed hereinafter, and shown in and by the appended drawings, relating in particular to.

Table 1 a translation table of the preprocessor.

DETAILED DESCRIPTION OF PREFERRED EMBODIMENTS

Figure 1:
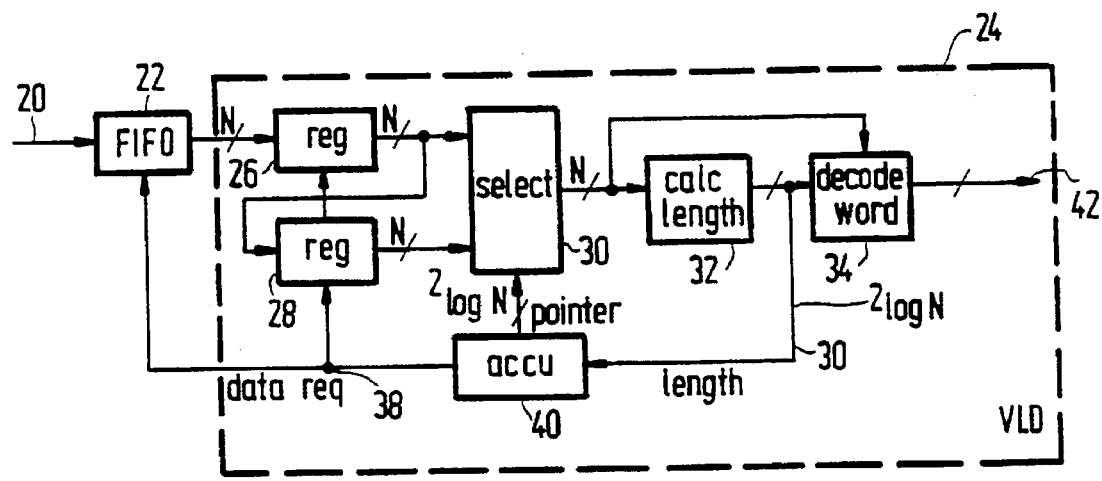
FIG. 1 an architecture according to the citation.

First, for better reference, FIG. 1 shows an architecture according to the citation. On input 20 the encoded data arrives in the shape of a series of words that has a substantially fixed throughput rate. The words themselves have different lengths, usually in a restricted set of such lengths. Block 22 is a FIFO memory that stores the words in their order of arrival. As shown, it has a data output width of N bits, wherein for example, N=8. The remainder of the arrangement in block 24 represents the variable length decoder proper. Blocks 26, 28 are two series connected registers that have a combined data output path of 2N bits wide. In principle, this structure may have still wider output, but such is a matter of designer's choice. Block 30 is a selector or barrel shifter that under control of a pointer received from accumulator selects N bits from the 2N bits received. These N bits comprise the segment to be subsequently decoded. In the present set-up, the pointer may have a range of N different values (the N+1$^{st}$ is not used). In block 32, from the value of the code segment received, the length of the encoded data segment is calculated as represented by a string of $^2$lnN=3 bits that is forwarded to block 34. By itself, other representations of the localizer information are feasible, for example a so-called one-hot code, that has one first value bit, all other bits having the second value. Moreover, block 34 directly receives the encoded segment itself from selector 30. This allows to execute the decoding of the encoded segment. The decoded data string is outputted on output 42 at an appropriate bit width that has not been specified inasmuch as it is application-dependent. The length of the encoded segment is fed back to accumulator 40 to produce a new pointer that indicates where the next encoded segment at the input data path of selector 30 commences. If accumulation in block 40 produces a carry, it is forwarded to FIFO 22 and register bank 26/28 for controlling a new read out and bytewise shift.

Figure 2:
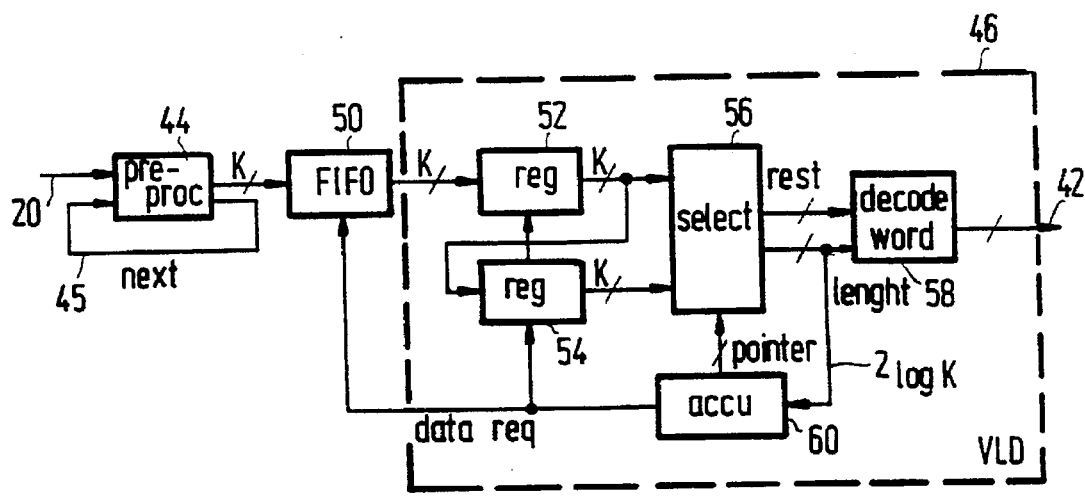
FIG. 2 an architecture according to the invention.

FIG. 2 shows an architecture according to the invention. A large part of the arrangement, in particular blocks 50, 52, 54, 56, 60, has a similar structure as FIG. 1, albeit at a path width of K bits. Generally, the value of K is determined by the maximum length of the decoded data segments, which in the embodiment hereinafter is equal to 20. However, for architectural reasons, a value of 32 (a power of 2) will rather be chosen. The essential changes however, are represented by preprocessor 44 that receives the encoded segments and through retrocoupling 45 recurrently activates its next state. The preprocessor calculates the length of each encoded segment and store this in FIFO 50 along with the still encoded segment. Now, the preprocessor has a constant input rate and a variable output rate. Various methods may be applied for executing further re-coding. The operation of the pre-processor will be explained more in detail with reference to Table 1, that has been derived from the standard recited in the MPEG-1 code book for AC dct-coefficients, that by itself is not related to the present invention. The table has five columns that successively contain the length of the encoded segment, the data content of the encoded segment, the length of the new code word as outputted by the preprocessor, the content of the length-indicating bits as outputted by the pre-processor, and the remaining bits that represent the value of the data. Now, a bit indicated b represents data and may have the value 1 or 0 as the data content requires. A bit represented by an asterisk is don't care and only serves to make up the length of the output word of the preprocessor, so that each different length indication in the fourth column indeed represents a unique length of the preprocessed code word (inasfar as the length of the corresponding encoded segment is also unique). Now, K is the greatest length of a word output by the preprocessor, in this case 20 bits. From statistical considerations it follows that the pre-processor already causes some data expansion, because the shortest encoded segments occur relatively often. This means that also the FIFO capacity is raised somewhat with respect to the earlier solution.

An alternative to the embodiment shown in FIG. 2 would be to store the value of the new pointer for the VLD in the first five bits of the new code instead of the length of the new code word. This would imply that the critical path would consist of just one major delay necessary for selecting K bits out of a register containing 2K bits. This would mean that the accumulator is transferred from the VLD proper to the pre-processor. In order to decode the new code word, this solution would then require a subtractor for calculating the next length. The subtractor however, does then form no part of the critical feedback loop path.

In order to reduce the size of the FIFO buffer it is possible to make use of the don't care bit positions, that could serve to indicate the selection to be made, if larger new code words would be merged with smaller new code words. For example, if the don't care bit of new code words with length 9 is equal to zero, the original code word with a length of 6 bits will be decoded. Otherwise (don't care bit equal to 1), it will be assumed that the original code word had a length of seven bits and is decoded accordingly. This results in a somewhat smaller buffer and absence of new code words with ten bits' length.

The new architecture describes a constant-output rate Variable Length Decoder, whereas due to the preprocessor there will be no problems concerning the achievable rate. Although the buffer will be somewhat larger than in case of the conventional constant output rate VLD, it will be much smaller than if it had been provided at the output side for buffering dam only after decompression. Since the pre-processor operates only at the speed of the input transfer channel it will have no speed problems. Besides this, it has no restrictions as regards its recoding algorithm. Compared to the referenced architecture, the total amount of processing hardware (pre-processor and VLD taken together) will only increase little or increase not at all.

In case of a hierarchical bit stream such as is the case with the MPEG protocol, the decoding can simplified further by putting the length of for example a complete dct-block at the start of a hardware block in the FIFO-buffer. The preprocessor will easily and straightforwardly be able to calculate this latter length. This extension can also be used with a non-hierarchical bit stream: this means that the preprocessor divides the input stream into blocks each of a uniform number of code words. In this case the preprocessor does not influence the content of the encoded words proper.

Figure 3:
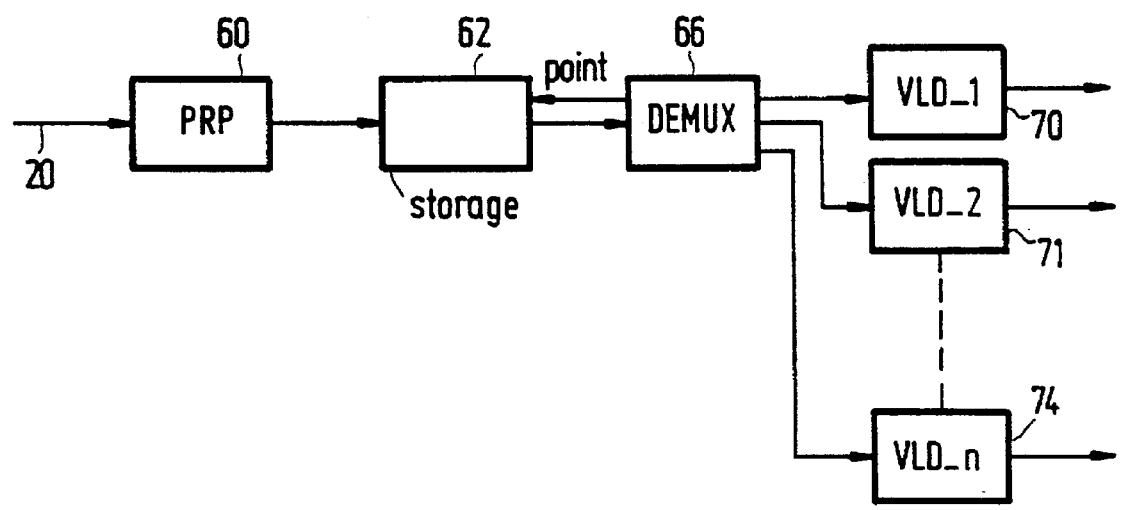
FIG. 3 a parallel architecture according to the invention.

FIG. 3 shows a parallel architecture according to the invention, in particular for operating in a high-frequency environment, such as, for example at 27 MHz that is proper to television broadcasting. The encoded segments again arrive on input 20 to be preprocessed in preprocessor 60. This in the first place produces the preprocessed data for subsequent storage in block 62. Block 66 effectively operates as a demultiplexer over the elements of a set of n Variable Length Decoders $VLD_{13}1 \ldots n$ (70 ... 74), of which the number has not been specified quantitatively. Setting up of multiplexer 66 is done under control of a supra-pointer information from pre-processor 60 in a way not shown. Now, blocks VLD may be constituted either like block 24 in FIG. 1 or as block 46 in FIG. 2. Furthermore, the preprocessor gets again the next-state information through its own feed-back interconnection. The blocks VLD have been shown as being demultiplexed in space. Therefore, their actual operational speed with respect to a single VLD block is also lowered by a factor of n. Another solution is to have them multiplexed in time. In this case, the feed-back loop of elements 30, 32, 40 in FIG. 1 or elements 56, 60 in FIG. 2 contains as many registers as is the value of n. This allows for retiming, thereby diminishing the problems of the feed-back delay. The main delay would be in selectors 30/56. Of course, the multiplexing can be done in space as well as in time simultaneously. Generally, if the input stream is provided with marker information that allows for on-marker synchronizing, the preprocessor boils down to a counter mechanism with n positions, n being the total number of substreams. In the opposite case, where the input stream has not been so provided with markers, the preprocessor needs both a counting mechanism and a recoding mechanism of the general appearance as has been discussed with reference to block 44 in FIG. 2.

Figure 4:
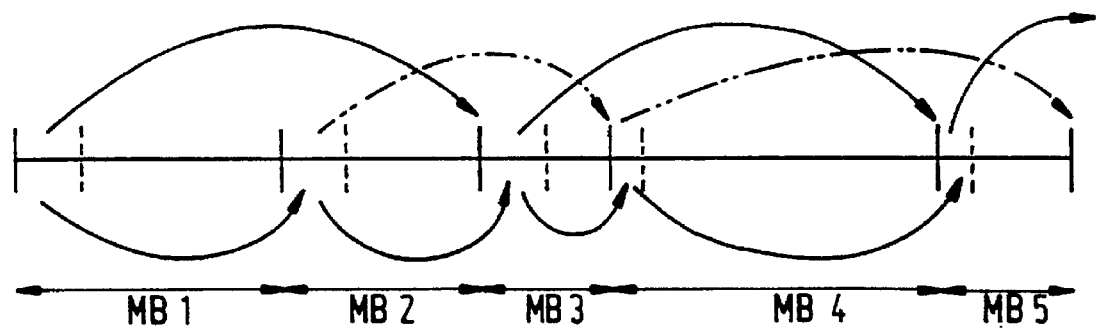
FIG. 4 an example of a FIFO addressing structure.

FIG. 4 gives an example of a FIFO addressing structure for the case n=2 in the arrangement of FIG. 3. The solid arrows interconnect the odd numbered data segments. The interrupted arrows interconnect the even numbered data segments. Each time the odd and even segments alternate. With n at a higher value, the interchange would again be cyclical. The chaining has been shown to jump over the "other" segments; alternatively, the chaining can be to the next segment, provided that the device knows the value of n.

We claim:

1. A variable length decoder for decoding an input bit stream which includes a plurality of variable-length encoded data segments, comprising:

input preprocessor means for receiving the input bit stream, determining the length of each of the data segments, appending a segment length word to each data segment, each said segment length word being indicative of the length of its associated data segment, and outputting a pre-processed input bit stream including the plurality of data segments and respective ones of said segment length words;

input means for receiving the pre-processed input bit stream and for providing a decoding window that includes a sequence of bits which includes one or more data segments and respective ones of said segment length words;

pointer means for iteratively producing a pointer in response to successive ones of said segment length words, wherein said input means is responsive to said pointer for shifting said decoding window to provide a new sequence of bits which includes one or more additional data segments and respective ones of said segment length words; and, decoder means for decoding said data segments in said decoding window and for producing an output bit stream of decoded data segments.

2. The variable length decoder as set forth in claim 1, further comprising a buffer memory coupled between said input preprocessor means and said input means for temporary storage of said pre-processed input bit stream.

3. The variable length decoder as set forth in claim 2, wherein said input means includes:

a first register for receiving said pre-processed input bit stream, and for outputting a first parallel sequence of input bits;

a second register coupled to an output of said first register, and for outputting a second parallel sequence of input bits;

a barrel shifter having an input coupled to said first and second parallel sequences of input bits to thereby provide a parallel sequence of available input bits equal in number to the total of said first and second parallel sequences of input bits, and for providing said decoding window at an output thereof; and, wherein said decoding window is shifted in response to said pointer across said parallel sequence of available input bits.

4. The variable length decoder as set forth in claim 2, wherein said buffer memory comprises a FIFO buffer memory device.

5. The variable length decoder as set forth in claim 1, wherein said pointer means includes an accumulator.

6. The variable length decoder as set forth in claim 5, wherein said input means includes:

a first register for receiving said pre-processed input bit stream, and for outputting a first parallel sequence of input bits;

a second register coupled to an output of said first register, and for outputting a second parallel sequence of input bits;

a barrel shifter having an input coupled to said first and second parallel sequences of input bits to thereby provide a parallel sequence of available input bits equal in number to the total of said first and second parallel sequences of input bits, and for providing said decoding window at an output thereof; and, wherein said decoding window is shifted in response to said pointer across said parallel sequence of available input bits.

7. The variable length decoder as set forth in claim 1, wherein each of said segment length words has the same bit length.

8. The variable length decoder as set forth in claim 1, wherein each of said segment length words is appended to the head of its associated data segment.

9. The variable length decoder as set forth in claim 1, wherein said input means includes:

a first register for receiving said pre-processed input bit stream, and for outputting a first parallel sequence of input bits;

a second register coupled to an output of said first register, and for outputting a second parallel sequence of input bits;

a barrel shifter having an input coupled to said first and second parallel sequences of input bits to thereby provide a parallel sequence of available input bits equal in number to the total of said first and second parallel sequences of input bits, and for providing said decoding window at an output thereof: and, wherein said decoding window is shifted in response to said pointer across said parallel sequence of available input bits.

10. The variable length decoder as set forth in claim 1, wherein said input preprocessor means includes a buffer memory for temporary storage of said pre-processed input bit stream.

11. A variable length decoder for decoding an input bit stream which includes a plurality of variable-length encoded data segments, comprising:

an input preprocessor circuit for receiving the input bit stream, determining the length of each of the data segments, appending a segment length word to each data segment, each said segment length word being indicative of the length of its associated data segment, and outputting a pre-processed input bit stream including the plurality of data segments and respective ones of said segment length words;

an input circuit for receiving the pre-processed input bit stream and for providing a decoding window that includes a sequence of bits which includes one or more data segments and respective ones of said segment length words;

a pointer generator circuit for iteratively producing a pointer in response to successive ones of said segment length words, wherein said input circuit is responsive to said pointer for shifting said decoding window to provide a new sequence of bits which includes one or more additional data segments and respective ones of said segment length words; and, a decoder circuit for decoding said data segments in said decoding window and for producing an output bit stream of decoded data segments.

12. The variable length decoder as set forth in claim 11, wherein said input circuit includes:

a first register for receiving said pre-processed input bit stream, and for outputting a first parallel sequence of input bits;

a second register coupled to an output of said first register, and for outputting a second parallel sequence of input bits;

a barrel shifter having an input coupled to said first and second parallel sequences of input bits to thereby provide a parallel sequence of available input bits equal in number to the total of said first and second parallel sequences of input bits, and for providing said decoding window at an output thereof; and, wherein said decoding window is shifted in response to said pointer across said parallel sequence of available input bits.

13. The variable length decoder as set forth in claim 12, further comprising a buffer memory coupled between said input preprocessor circuit and said input circuit for temporary storage of said pre-processed input bit stream.

14. The variable length decoder as set forth in claim 13, wherein said pointer generator circuit includes an accumulator.

15. The variable length decoder as set forth in claim 11, further comprising a buffer memory coupled between said input preprocessor circuit and said input circuit for temporary storage of said pre-processed input bit stream.

16. The variable length decoder as set forth in claim 15, wherein said buffer memory comprises a FIFO buffer memory device.

17. The variable length decoder as set forth in claim 11, wherein each of said segment length words has the same bit length.

18. The variable length decoder as set forth in claim 11, wherein each of said segment length words is appended to the head of its associated data segment.

19. The variable length decoder as set forth in claim 11, wherein said pointer generator circuit includes an accumulator.

20. A method for decoding an input bit stream which includes a plurality of variable-length encoded data segments, comprising:

receiving the input bit stream, determining the length of each of the data segments, appending a pointer word to each data segment, each said pointer word being indicative of the starting bit position of its associated data segment, and outputting a pre-processed input bit stream including the plurality of data segments and respective ones of said pointer words;

providing a decoding window that includes a sequence of bits which includes one or more data segments and respective ones of said pointer words;

shitting said decoding window in response to successive ones of said pointer words to provide a new sequence of bits which includes one or more additional data segments and respective ones of said pointer words; and, decoding said data segments in said decoding window and producing an output bit stream of decoded data segments.

* * * * *